United States Patent
Seo et al.

(10) Patent No.: US 7,300,845 B2
(45) Date of Patent: Nov. 27, 2007

(54) METHOD OF MANUFACTURING RECESS TYPE MOS TRANSISTOR HAVING A DUAL DIODE IMPURITY LAYER STRUCTURE

(75) Inventors: Hyeoung-Won Seo, Gyeonggi-do (KR); Du-Heon Song, Gyeonggi-do (KR); Dae-Joong Won, Seoul (KR); Sang-Hyun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 300 days.

(21) Appl. No.: 11/022,056

(22) Filed: Dec. 23, 2004

(65) Prior Publication Data
US 2005/0196947 A1 Sep. 8, 2005

(30) Foreign Application Priority Data
Dec. 23, 2003 (KR) .................. 10-2003-0095141

(51) Int. Cl.
*H01L 21/336* (2006.01)
(52) U.S. Cl. .............. 438/270; 438/286; 438/306; 438/589; 257/E21.618
(58) Field of Classification Search ............ 438/286
See application file for complete search history.

(56) References Cited

U.S. PATENT DOCUMENTS

| | | | |
|---|---|---|---|
| 5,160,491 A * | 11/1992 | Mori ........................ | 438/270 |
| 5,576,567 A * | 11/1996 | Mori ........................ | 257/316 |
| 5,693,547 A * | 12/1997 | Gardner et al. ........... | 438/270 |
| 6,673,681 B2 * | 1/2004 | Kocon et al. ............. | 438/270 |
| 7,163,865 B2 * | 1/2007 | Kim ......................... | 438/270 |

FOREIGN PATENT DOCUMENTS

JP 03011765 A * 1/1991

* cited by examiner

*Primary Examiner*—Stephen W. Smoot
(74) *Attorney, Agent, or Firm*—Marger Johnson & McCollom, P.C.

(57) ABSTRACT

The method of manufacturing a recess type MOS transistor improves a refresh characteristic. In the method, a channel impurity region is formed by ion implanting a first conductive impurity in an active region of a semiconductor substrate. Thereon, a second conductive impurity and the first conductive impurity are ion-implanted each alternately into the active region, to thus sequentially form first to third impurity regions having a dual diode structure on the channel impurity region, the second conductive impurity having conductivity opposite to the first conductive impurity. A trench is formed, and a gate insulation layer is formed in a gate region to produce a gate stack. The first conductive impurity is selectively ion-implanted in a source region, to thus form a fourth impurity region. A spacer is then formed in a sidewall of the gate stack, and the second conductive impurity is ion-implanted in the source/drain regions, to form a fifth impurity region.

39 Claims, 17 Drawing Sheets

METHOD OF MANUFACTURING RECESS TYPE MOS TRANSISTOR HAVING A DUAL DIODE IMPURITY LAYER STRUCTURE

CROSS REFERENCE TO RELATED APPLICATIONS

This application claims priority from Korean Patent Application No. 2003-95141, filed on Dec. 23, 2003, the content of which is hereby incorporated by reference in its entirety for all purposes.

BACKGROUND OF THE INVENTION

1. Field of the Invention

This disclosure relates to a semiconductor memory device, and more particularly, to a method of manufacturing a recess type MOS transistor, from which a refresh characteristic can be improved through an impurity region having a dual diode structure.

2. Description of the Related Art

MOS (Metal-Oxide Semiconductor) devices are increasingly miniaturized in response to the desire to increase the integration of semiconductor devices. Channel lengths are reduced to the deep sub-micron level in order to increase an operating speed and current drive capability of the device.

According to the gradual reduction of channel length, source and drain depletion regions may invade the channel, causing a reduction to the effective channel length and the threshold voltage. This causes a short channel effect that may cause a gate control function to be lost in a MOS transistor.

In order to reduce these short channel effects, a conductive dopant may be ion-implanted into a lower part of the gate region, the conductive dopant having a conductivity type opposite to that of a conductive impurity doped in the source/drain regions. However, when a high electric field is applied in such a semiconductor device, a hot carrier effect may occur. The hot carrier again generates collision ionization so that the hot carrier invades into an oxide layer, that is, the oxide layer is degraded with a defect of the device.

To reduce the hot carrier effect, most transistor manufacturing processes employ an LDD (Lightly Doped Drain) structure, and this produces a buffer region of low density between the gate region and a drain region of low density.

In the meantime, a continuous requirement for a high integration of semiconductor device makes the channel length be shorter, thus the transistor of the LDD structure also has a limitation in reducing the short channel effect and the hot carrier effect. Furthermore, there is caused a punchthrough effect when the source and drain impurities diffuse toward side faces during operation of the transistor.

To solve the above problems and to further reduce a size of high-density memory cells formed inside a semiconductor substrate, there is a requirement to develop a transistor having a recessed or grooved channel based on more lengthened channel-length instead of a planar-type per unit area.

The recess-type MOS transistor increases an effective channel length by forming a trench in a region where a channel will be formed, to thus improve a punchthrough of source and drain regions and actually extend a distance between the source and drain regions so as to be consequently helpful for a high integration of semiconductor device.

FIGS. 1A to 1J are cross-sectional diagrams illustrating a conventional method of manufacturing a recess-type MOS transistor.

As shown in FIG. 1A, a first pad oxide layer 12 and a second hard mask layer 14 are sequentially formed on a semiconductor substrate 10.

As shown in FIG. 1B, photoresist is deposited on the first hard mask layer 14, and is then patterned to partially expose the hard mask layer 14. The first hard mask layer 14 is etched to expose the first pad oxide layer 12 by using the photoresist as an etch mask, to thus define an active region ACT. Then the photoresist is removed.

In FIG. 1C, the first pad oxide layer 12 and a portion of the semiconductor substrate 10 are sequentially removed by using the first hard mask layer 14 as an etch mask, to thus form a first trench T1 inside the semiconductor substrate 10.

In FIG. 1D, a device isolation film 16 is formed within the first trench T1 through a thermal oxidation process by using the first hard mask layer 14 or the first pad oxide layer as an oxidation prevention mask. All the first hard mask layer 14 and the first pad oxide layer 12 are removed by a chemical mechanical polishing (CMP) or etch back process, to partially expose the semiconductor substrate 10 on which the device isolation film 16 was formed. That is, the semiconductor substrate 10 is planarized.

In FIG. 1E, a P-type impurity is ion implanted with a low density at high energy into the semiconductor substrate 10 on which the device isolation film 16 was formed, to form a channel impurity region. With the exception of the portion of the semiconductor substrate occupied by the device isolation film 16, the channel impurity region is formed on the semiconductor substrate 10. Thus, the channel impurity region does not have a specific reference character or number in the drawings. In the active region ACT of the semiconductor substrate 10 on which the channel impurity region was formed, an N-type impurity is ion implanted, to form a third impurity region 17 having a predetermined depth from the surface.

In FIG. 1F, a second pad oxide layer 18 and a second hard mask layer 20 are sequentially accumulated on the semiconductor substrate 10 on which the third impurity region 17 was formed.

In FIG. 1G, photoresist is deposited on the semiconductor substrate 10 where the second hard mask layer 20 was formed, and is patterned through a photolithography process. Then, the second hard mask layer 20 is etched to expose the second pad oxide layer 18 by using the photoresist as an etch mask. Next, the photoresist is removed.

In FIG. 1H, the second pad oxide layer 18 and the semiconductor substrate 10 are sequentially etched by using the second hard mask layer 20 as an etch mask, to thus form a second trench T2 having a predetermined depth. A sidewall of the second trench T2 of the semiconductor substrate 10 is partially removed to isolate between a source region S and a drain region D.

In FIG. 1I, the second hard mask layer 20 and the second pad oxide layer 18, which were formed on the semiconductor substrate 12, are removed to expose the surface of the semiconductor substrate 10 and the device isolation film 16.

In FIG. 1J, a gate insulation layer 22 is formed on the semiconductor substrate 10 including the second trench T2.

In FIG. 1K, a gate electrode 24, a metal layer 26, and a gate upper insulation layer 28 are sequentially formed on the semiconductor substrate 10 on which the gate insulation layer 22 was formed.

In FIG. 1L, photoresist is deposited on an entire face of the semiconductor substrate 10 on which the gate upper insulation layer 28 was formed, and is then patterned through a photolithography process. The gate upper insulation layer 28, the metal layer 26, and the gate electrode 24 formed on the source/drain regions S/D and a portion of the device isolation film 16 are sequentially removed to form a gate stack 30 on a gate region G. Subsequently, an N-type impurity may be implanted at a low density in the semiconductor substrate of the source/drain regions S/D by using the gate stack 30 as an ion implantation mask, so as to form the third impurity region 17 in the source/drain regions S/D.

In FIG. 1M, a silicon nitride layer is formed on the semiconductor substrate 10 where the gate stack 30 was formed, and is then removed through a dry etching method having a prominent vertical characteristic, to form a spacer 34 in a sidewall of the gate stack.

In FIG. 1N, the N-type impurity is ion implanted at a high density in the semiconductor substrate 10 of the source/drain regions S/D by using the gate upper insulation layer 28 and the spacer 34 as an ion implantation mask, to thus form a fifth impurity region 36.

In FIG. 1O, the gate insulation layer 22 is removed from an upper part of the source/drain regions S/D of the semiconductor substrate 10 on which the fifth impurity region 36 was formed.

In FIG. 1P, an N-type impurity or polysilicon layer containing the N-type impurity is formed on the semiconductor substrate 10, and photoresist is deposited on the polysilicon layer, and is then patterned through a photolithography process. Next, the polysilicon layer is etched by using the photoresist as an etch mask, to form source/drain electrodes 38 (hereinafter, referred to as "pad polysilicon layer").

Subsequently, a first interlayer insulation layer is formed on the semiconductor substrate 10 on which the pad polysilicon layer 38 was formed, and is then removed from an upper part of the source region S, to form a first contact hole. Next, a bit line contact electrically coupled with the pad polysilicon layer 38 through the first contact hole is formed, and a second interlayer insulation layer is formed on the semiconductor substrate 10 including the bit line contact. The first and second interlayer insulation layers are removed from an upper part of the drain region D, to form a second contact hole. Thereon, a storage electrode, a dielectric layer and a plate electrode, which are electrically coupled with the pad polysilicon layer 38 through the second contact hole, are sequentially formed, completing a capacitor of a memory cell.

In the recess type MOS transistor manufactured according to the method described above, data applied to the bit line is stored in the memory cell capacitor by a gate voltage applied to the gate electrode 24, and then the data stored in the memory cell capacitor is outputted by a gate voltage applied to the gate electrode 24.

However, the method described above exhibits the following problems.

First, when a density of the first and second impurity ion-implanted into the third impurity region 17 or the channel impurity region increases in order to improve a threshold voltage characteristic of the transistor, a junction leakage current through a PN junction of the third impurity region 17 and the channel impurity region increases. This may lower a refresh characteristic of a cell capacitor formed on the drain region D.

Secondly, in case of reducing a depth and open critical dimension of the second trench T2, a depth of the third impurity region 17 that is symmetrically formed on the source/drain regions S/D can't be reduced any further, and a density of the P-type or N-type impurity ion-implanted into the third impurity region 17 and the channel impurity region can't be reduced any further. This increases the short channel effect.

Embodiments of the invention address these and other disadvantages of the conventional art.

SUMMARY OF THE INVENTION

Some embodiments of the invention provide a method of manufacturing a recess type MOS (Metal-Oxide Semiconductor) transistor, through which a threshold voltage characteristic of transistor may be improved and a junction leakage current may be reduced, improving the refresh characteristic of a cell capacitor. In the method, a short channel effect may be prevented or substantially reduced without reducing a density of a P-type or a N-type impurity that is ion-implanted in a third impurity region and in a channel impurity region when an open critical dimension and depth of a second trench are reduced.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

Exemplary embodiments of the invention are more fully described in detail with reference to FIGS. 2 and 3. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art. For example, though it is described that a source region is connected to a bit line and a drain region is connected to a cell capacitor in a recess type MOS transistor, its opposite connection configuration may be provided. Furthermore, a recess and a trench may be used together with the same or similar meaning.

Figure 3:
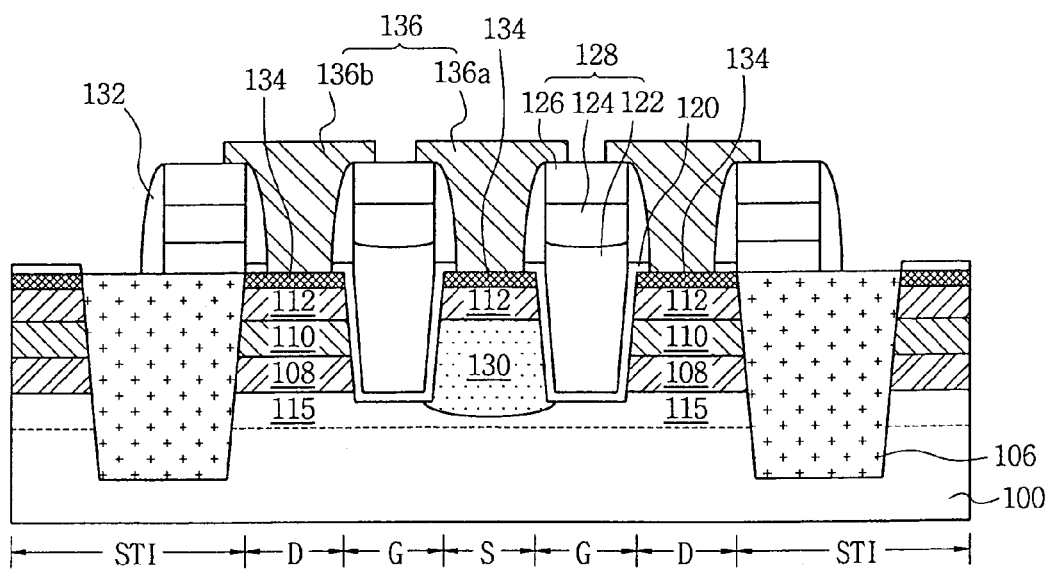
FIG. 3 is a cross-sectional diagram illustrating a structure of a recess type MOS transistor according to some embodiments of the invention.

FIG. 3 is a cross-sectional diagram illustrating a structure of a recess type MOS transistor according to some embodiments of the invention.

Referring first to FIG. 3, a gate stack 128 is formed along an upper part of a gate insulation layer 120 that is formed in a gate region G defined in an active region of a semiconductor substrate. Also, a first channel stopper region 130 as a fourth impurity region is formed to have a depth corresponding to the bottom neighborhood of a recess in the active region on which a drain electrode 136b or source electrode 136a of a transistor will be formed, so that the recess channel is asymmetrically formed only in one side part including a lower part of the gate insulation layer 120. Furthermore, first, second, and third impurity regions 108, 110, and 112, respectively, each having a depth smaller than the bottom of the recess, are formed. The first to third impurity regions 108, 110, 112 have a dual diode impurity layer, to reduce a junction leakage current in the active region of another side part including a lower part of the gate insulation layer on which the first channel stopper region 130 will be not formed.

Herewith, the first impurity region 108 has a depth smaller at least than the bottom of the recess. In a lower part of the first impurity region 108, a channel impurity region or a second channel stopper region 115 is formed.

Furthermore, the first to third impurity regions 108, 110, and 112 are doped with mutually opposite conductive impurities on their respective adjacent regions. That is, impurities doped in the first impurity region 108 have conductivity opposite to the impurities doped in the channel impurity region or a second channel stopper region 115. The first and second channel stopper regions 130 and 115 are doped with conductive impurity same as the channel impurity region, and a density of impurities doped in the respective regions has a difference.

Thus, in the recess type MOS transistor according to an exemplary embodiment of the invention, a PN diode of a shallow junction between the channel impurity region and the first impurity region 108, and a PN diode between the second impurity region 110 and the third impurity region 112, are formed in the drain region D corresponding to the source region S, that is, a junction leakage current can be reduced. Furthermore, the junction leakage current can be reduced by reducing a density of the conductive impurity doped in the first to third impurity regions 108, 110, and 112 and in the channel impurity region, improving a refresh characteristic of a cell capacitor formed on the drain region D.

Figure 1A:
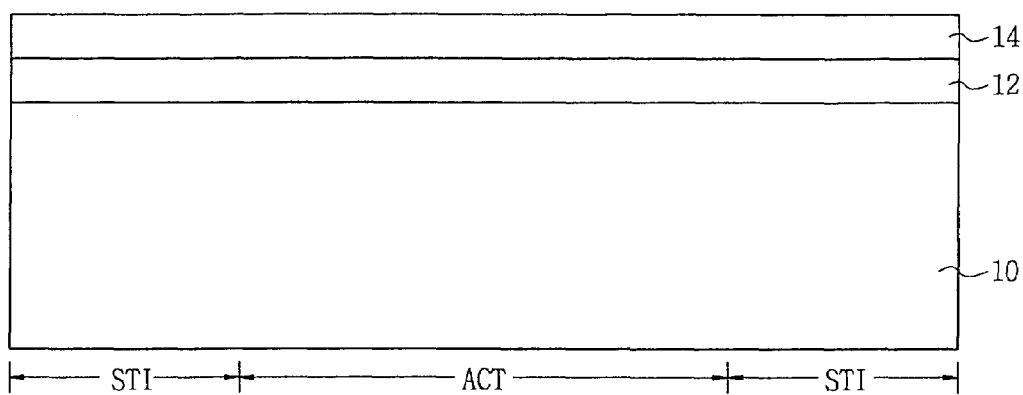
FIGS. 1A to 1P are cross-sectional diagrams illustrating a conventional method of manufacturing a recess type MOS transistor.
Figure 1B:
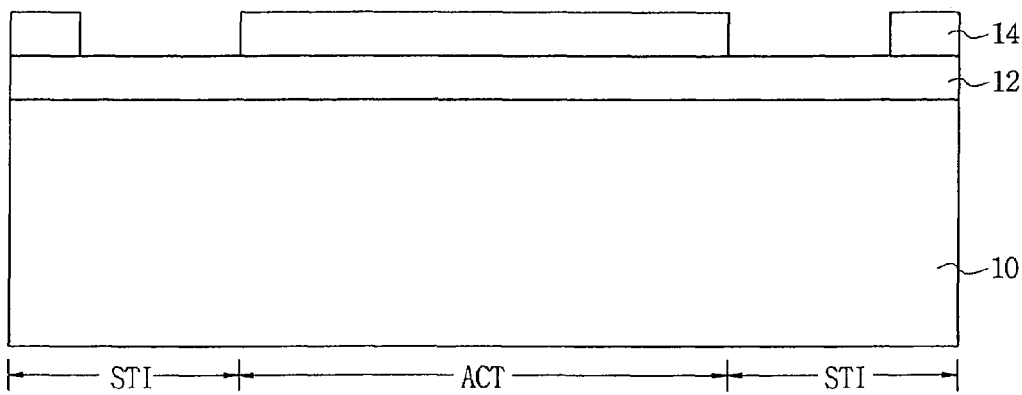
Figure 1C:
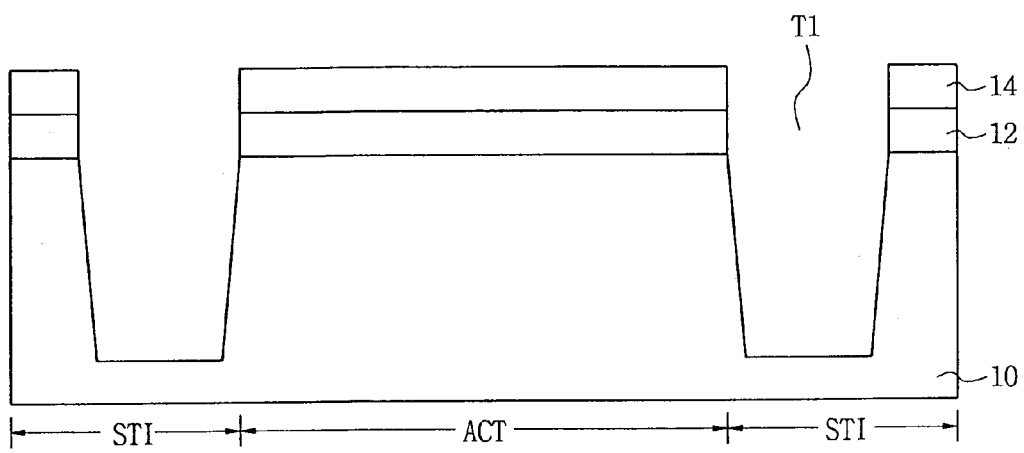
Figure 1D:
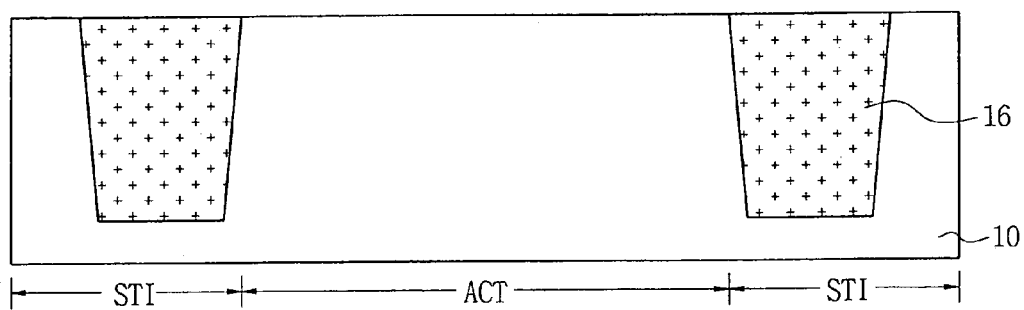
Figure 1E:
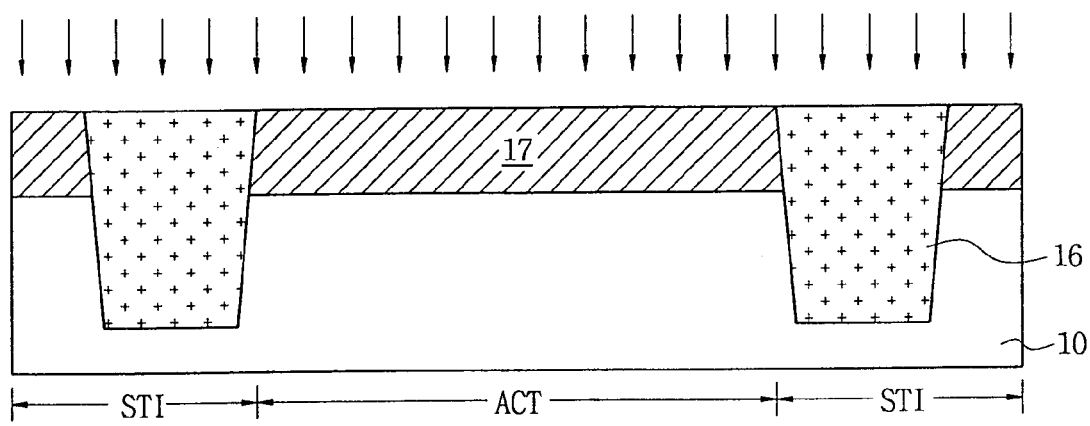
Figure 1F:
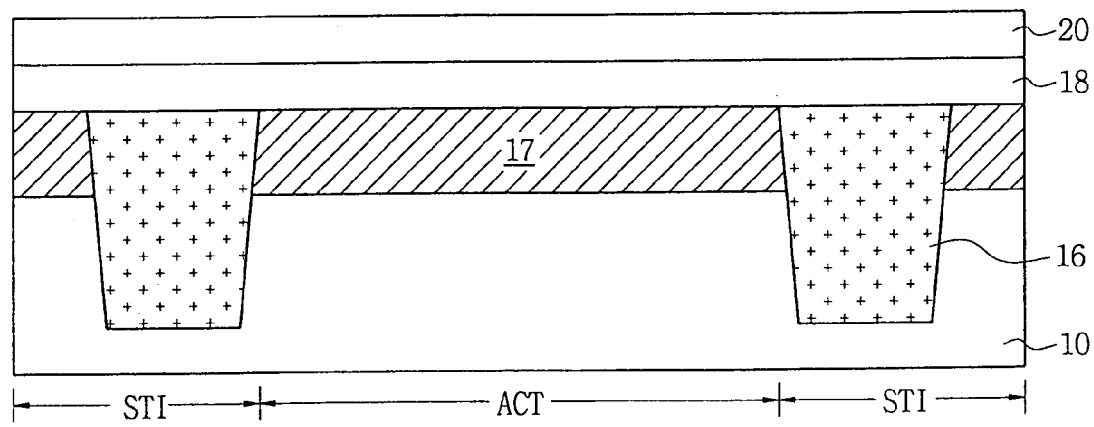
Figure 1G:
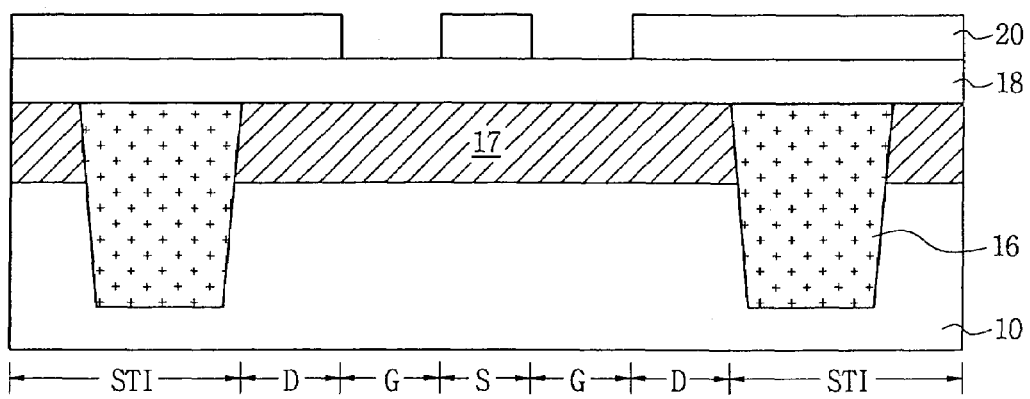
Figure 1H:
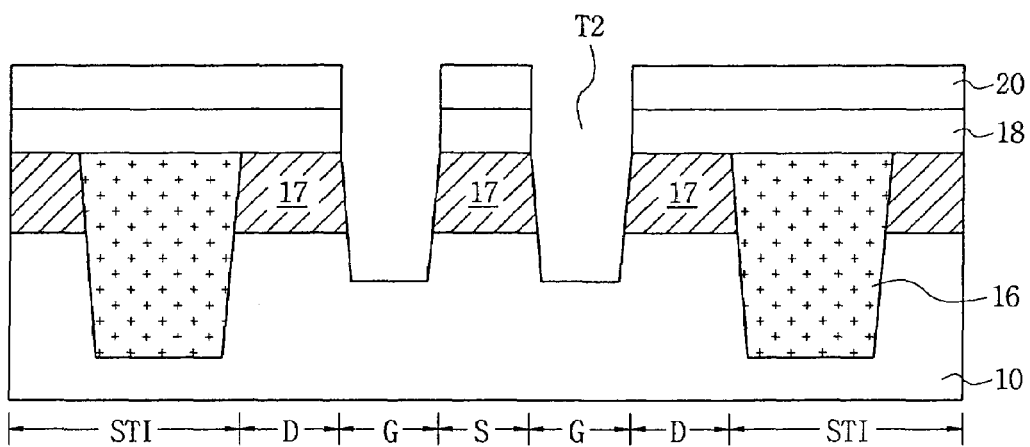
Figure 1I:
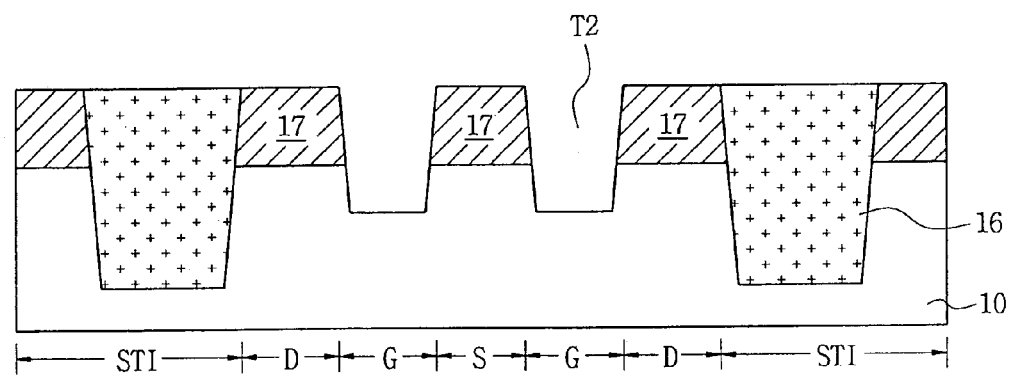
Figure 1J:
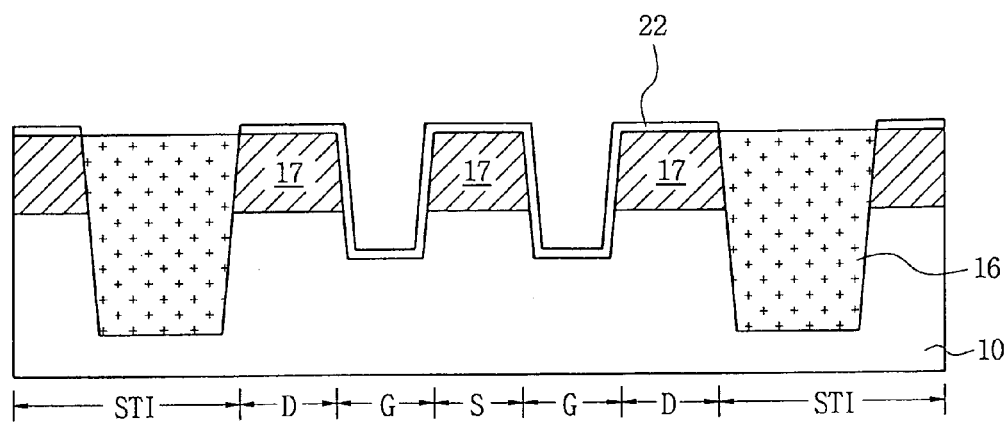
Figure 1K:
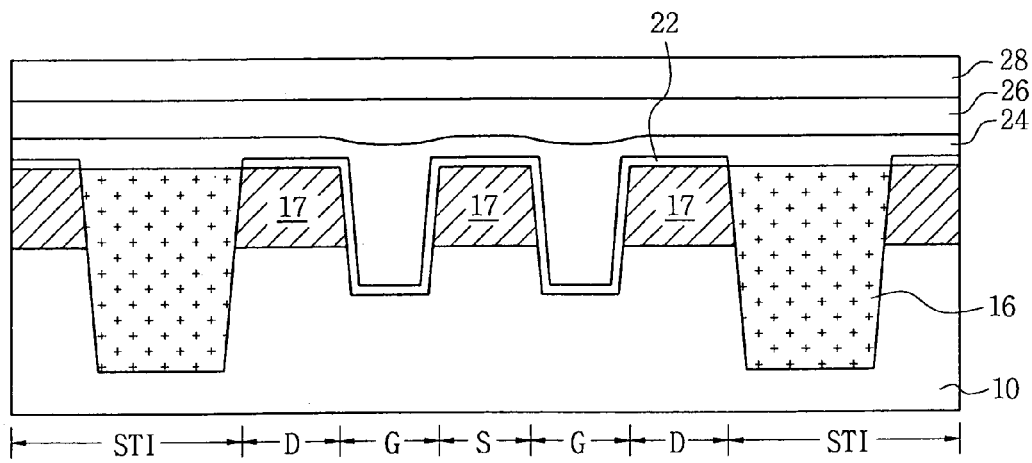
Figure 1L:
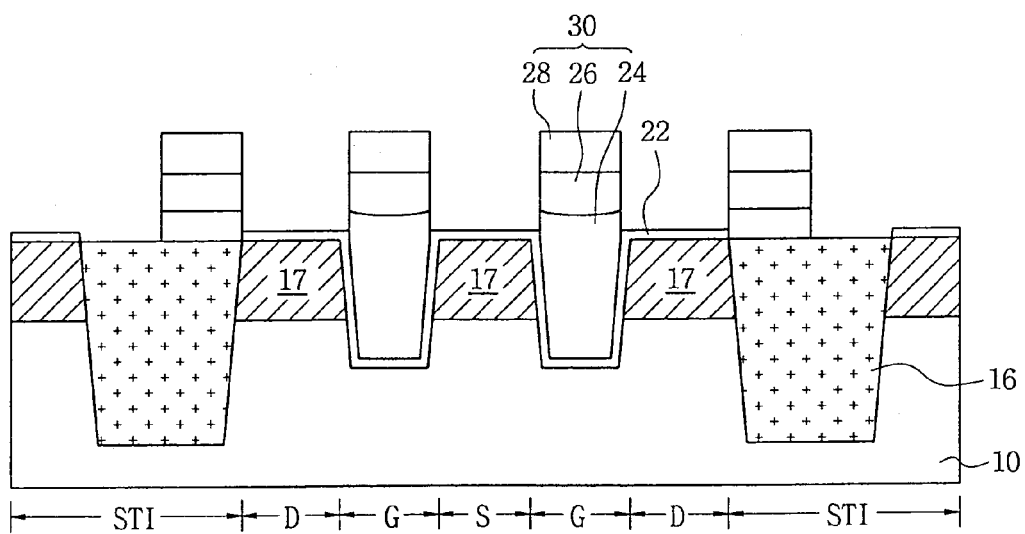
Figure 1M:
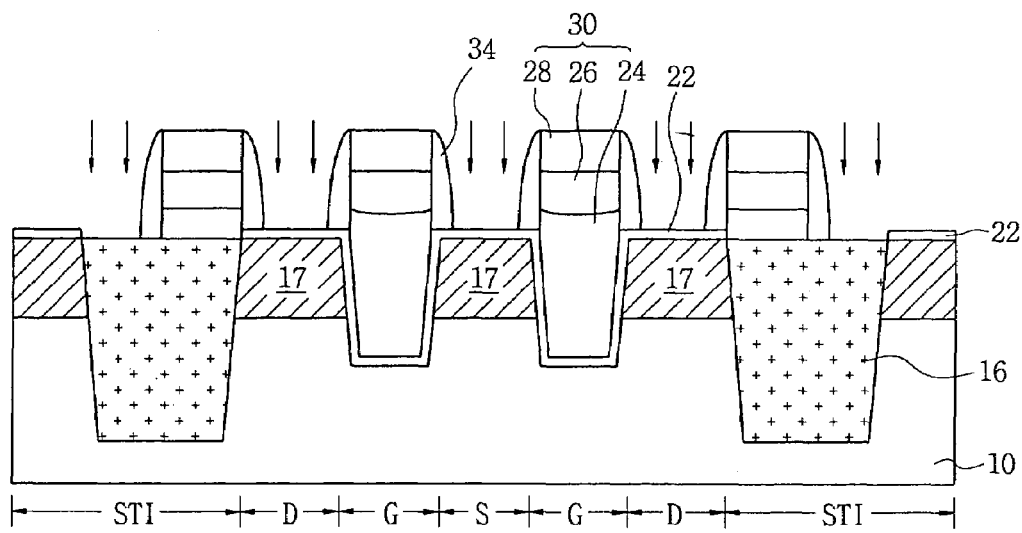
Figure 1N:
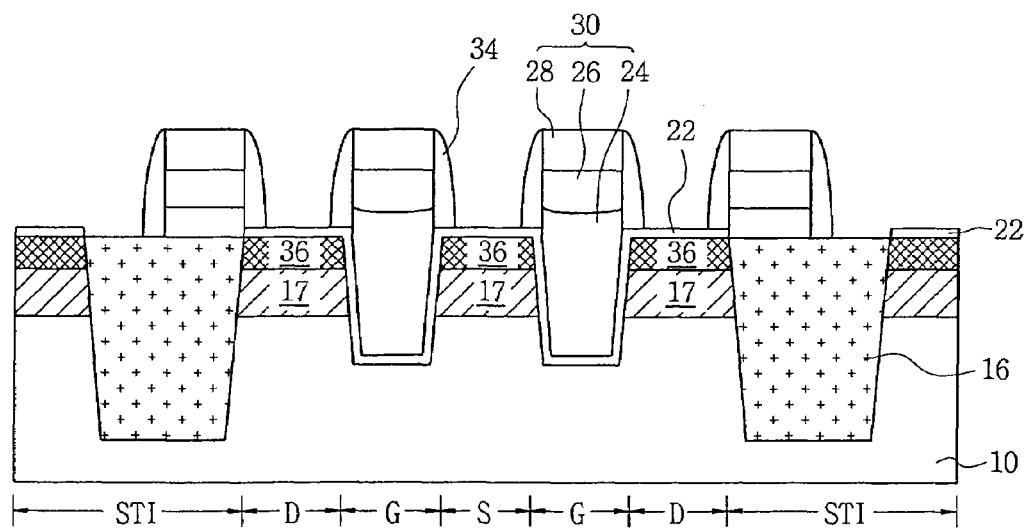
Figure 1O:
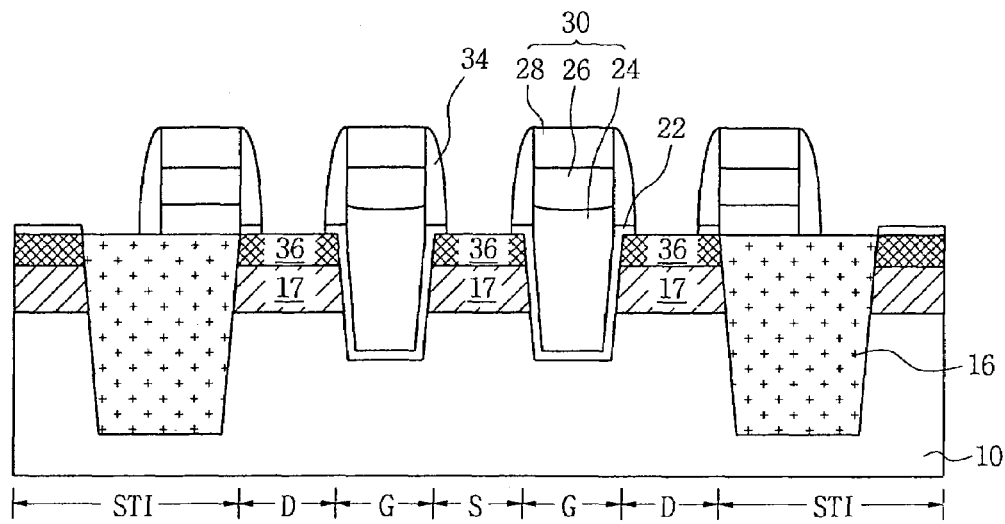
Figure 1P:
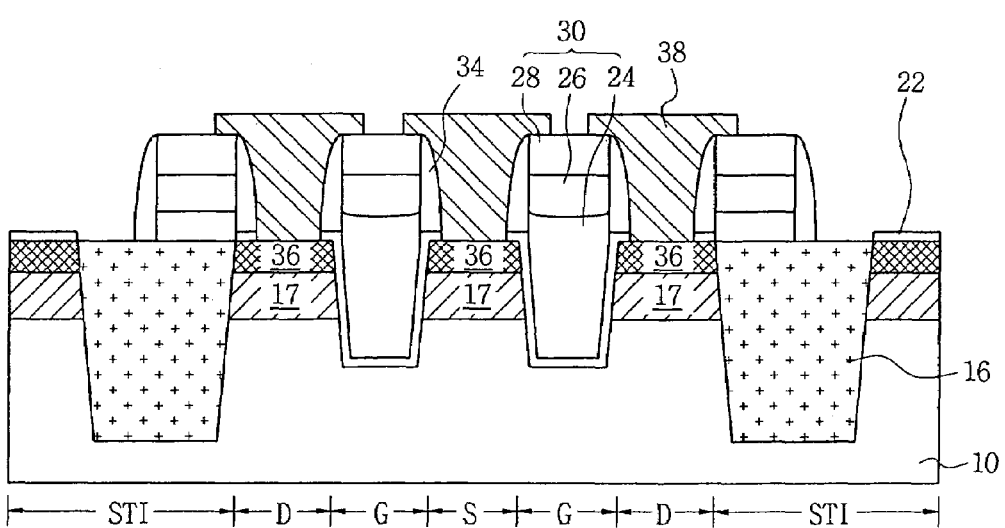
Figure 2A:
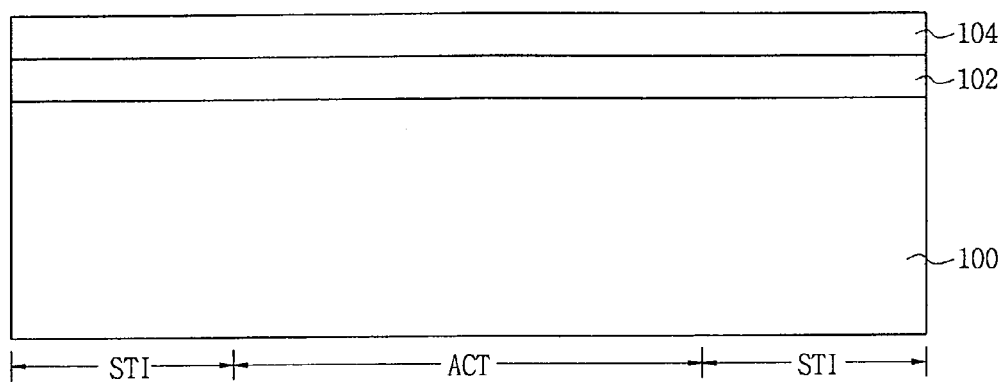
FIGS. 2A to 2Q are cross-sectional diagrams illustrating a method of manufacturing a recess type MOS transistor according to some embodiments of the invention.
Figure 2B:
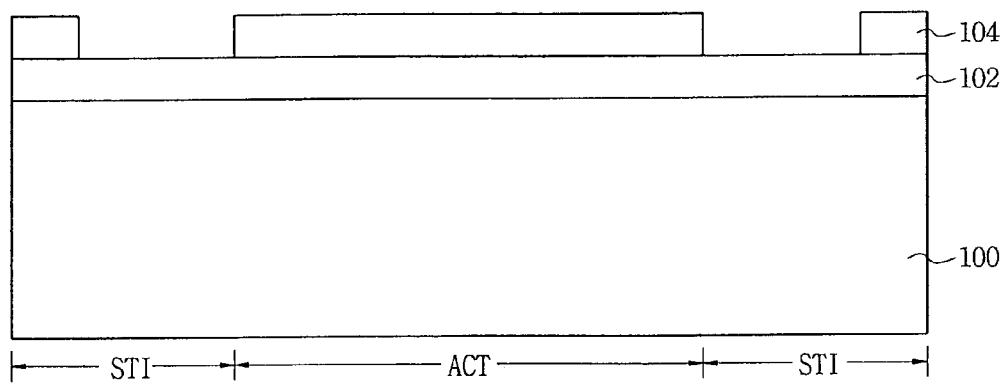
Figure 2C:
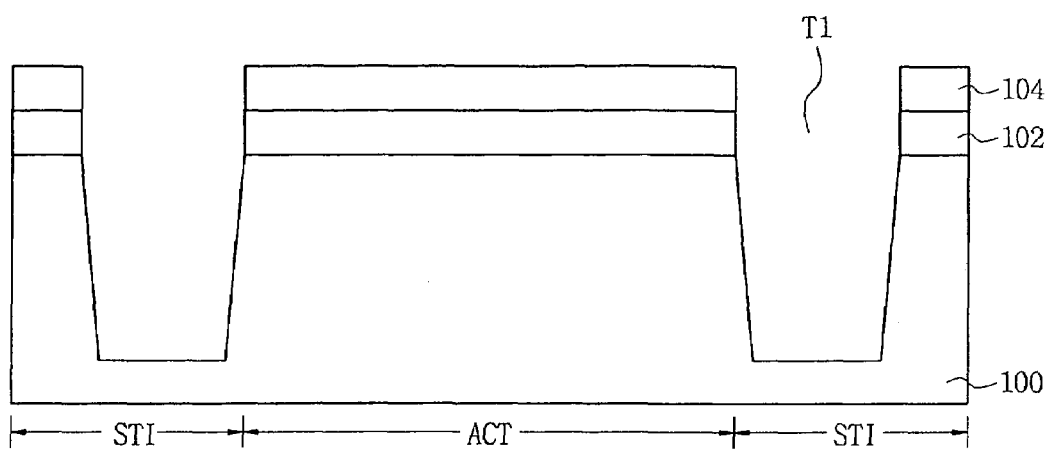
Figure 2D:
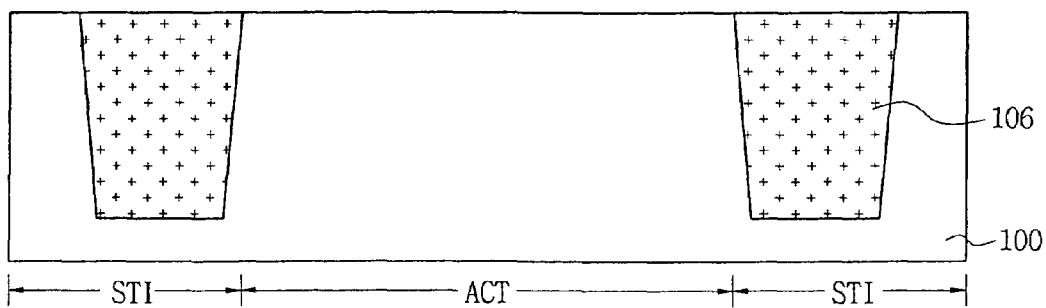
Figure 2E:
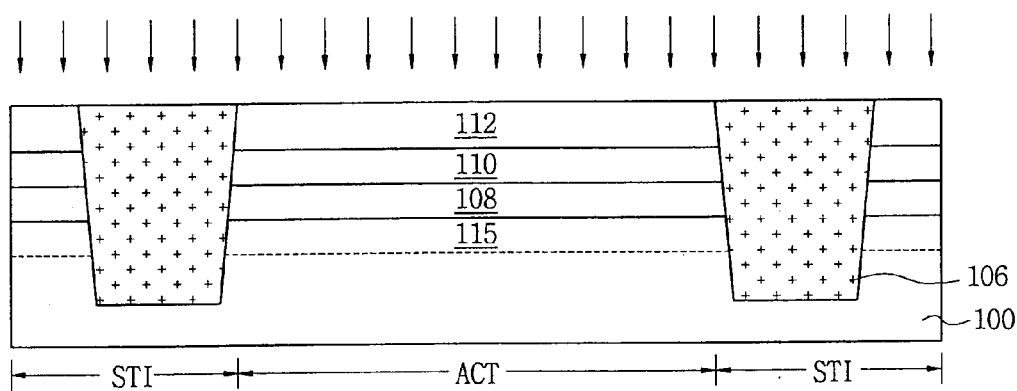
Figure 2F:
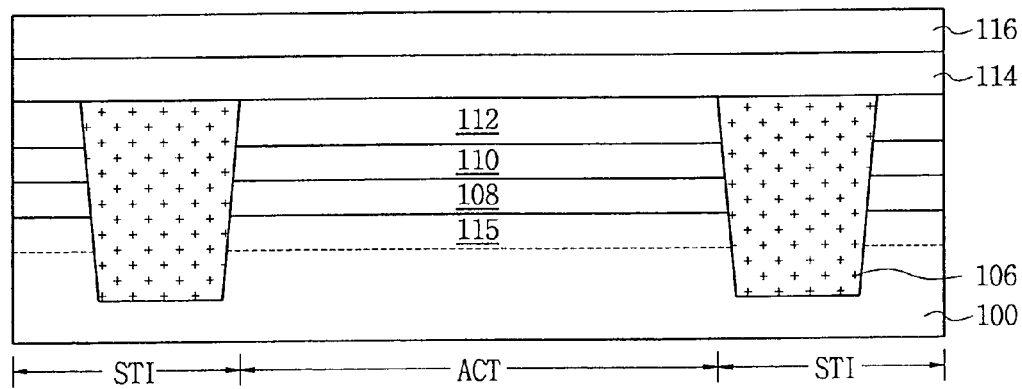
Figure 2G:
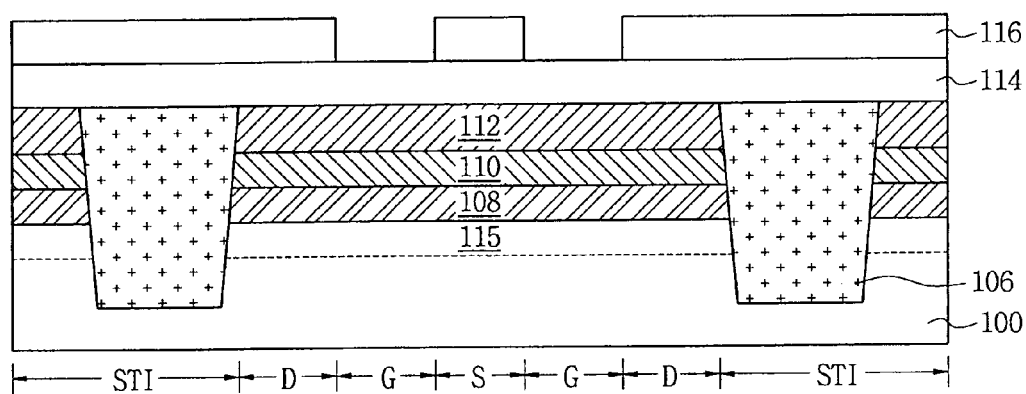
Figure 2H:
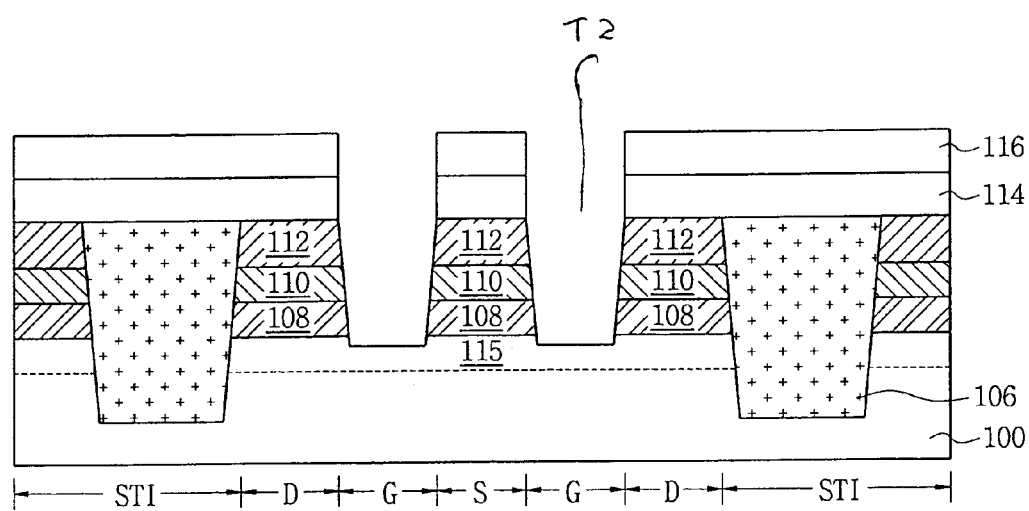
Figure 2I:
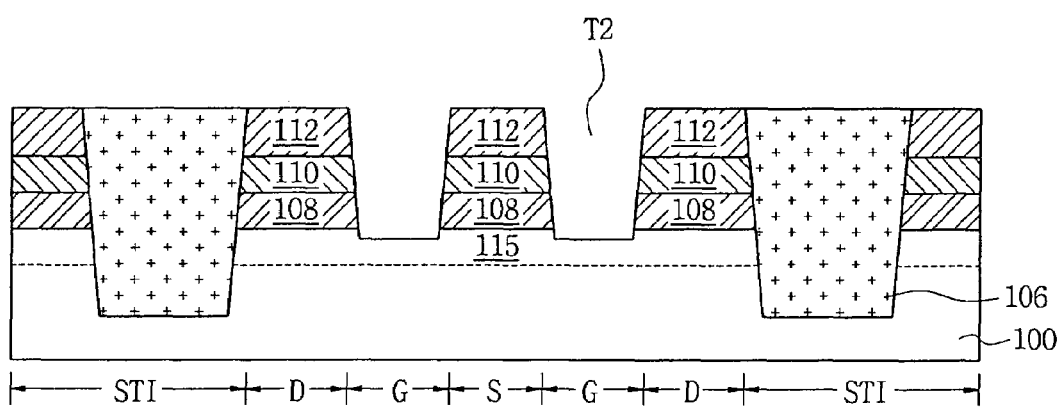
Figure 2J:
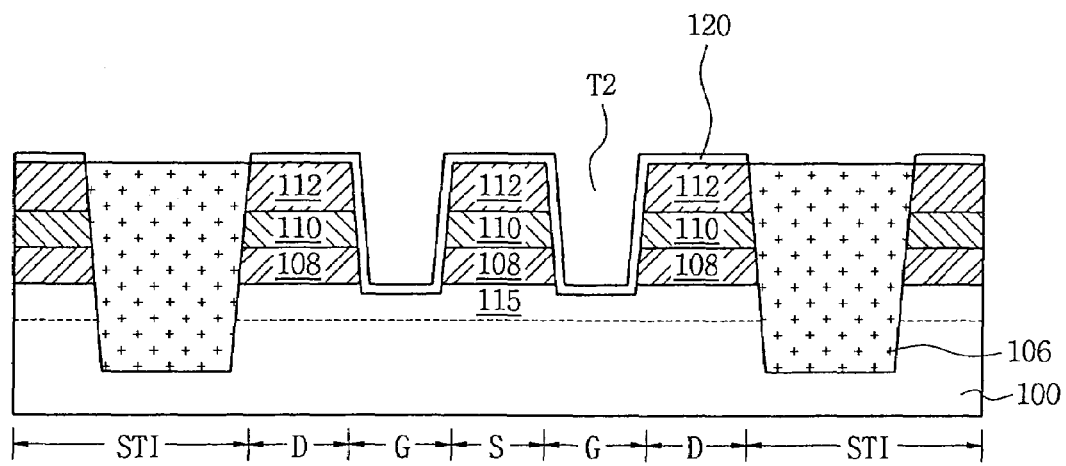
Figure 2K:
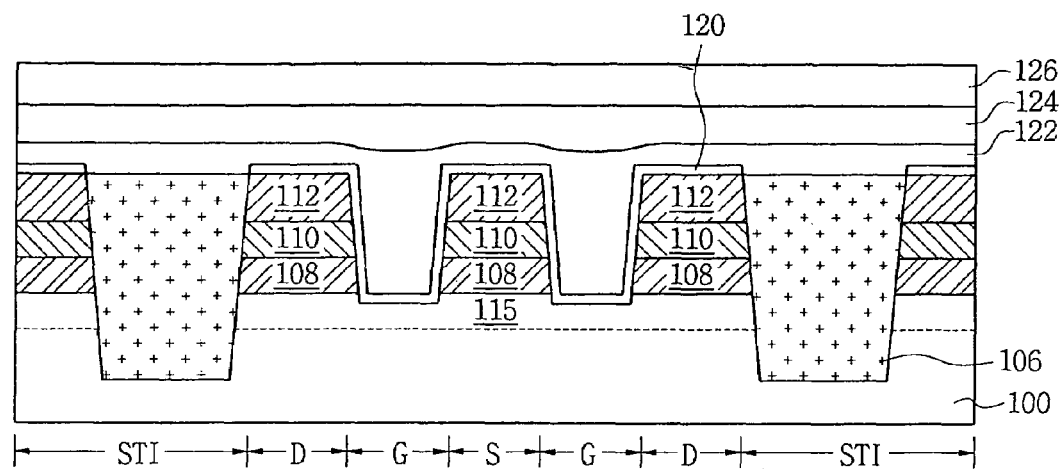
Figure 2L:
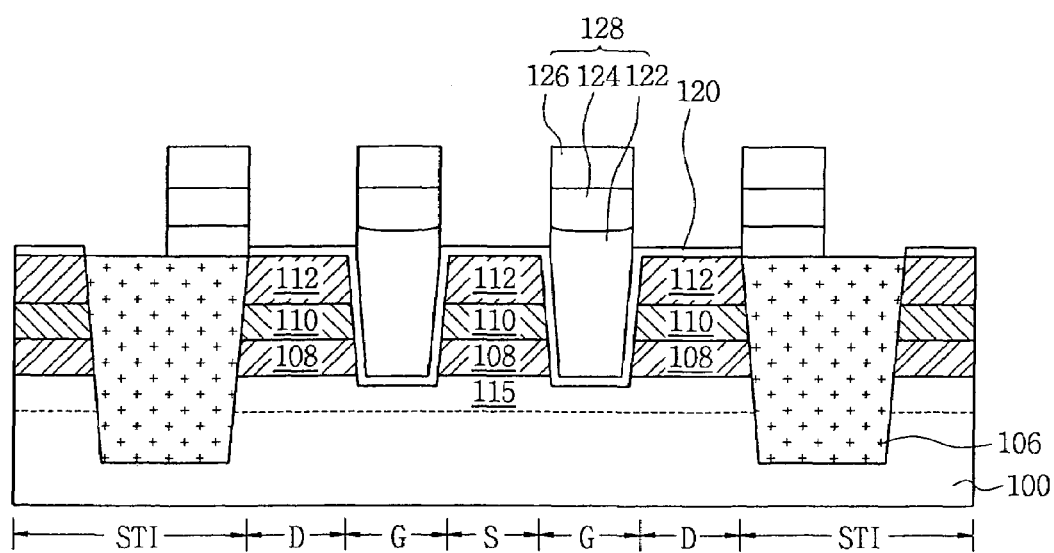
Figure 2M:
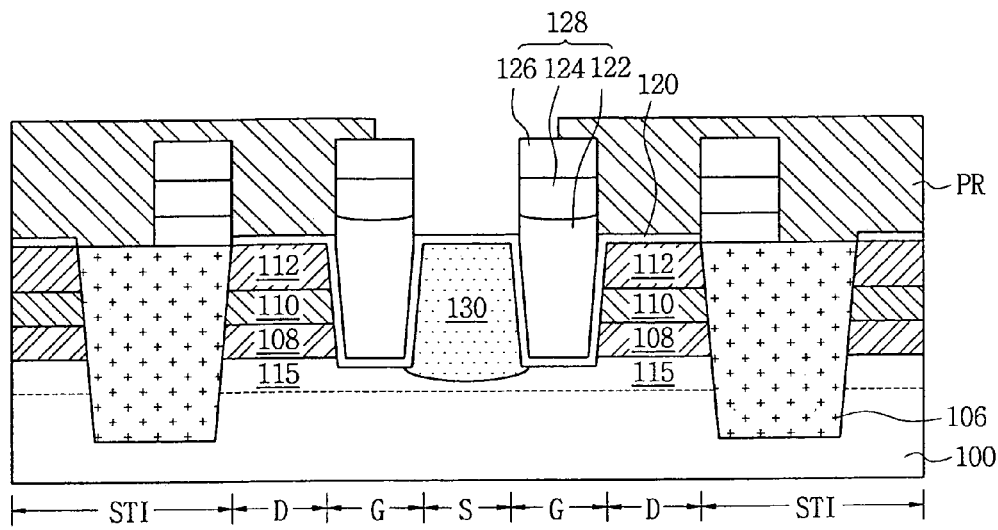
Figure 2N:
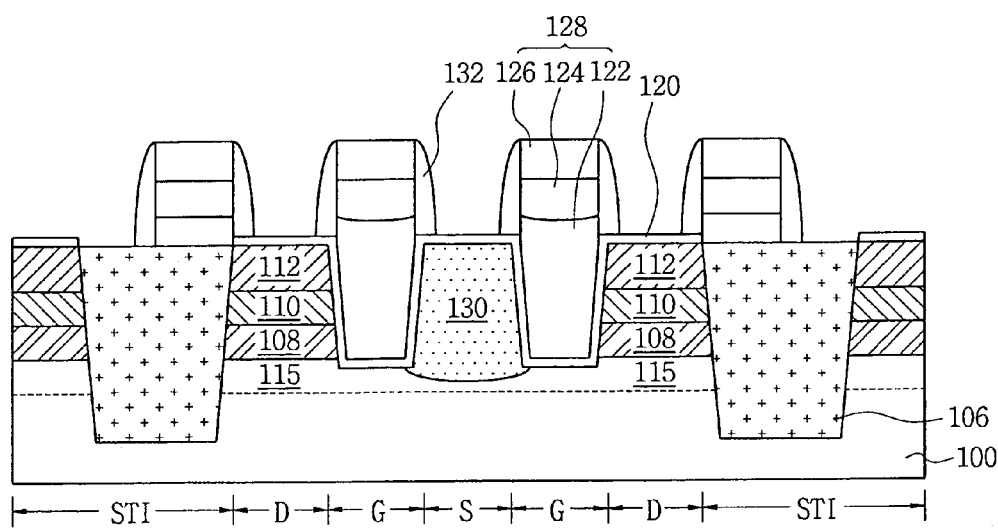
Figure 2O:
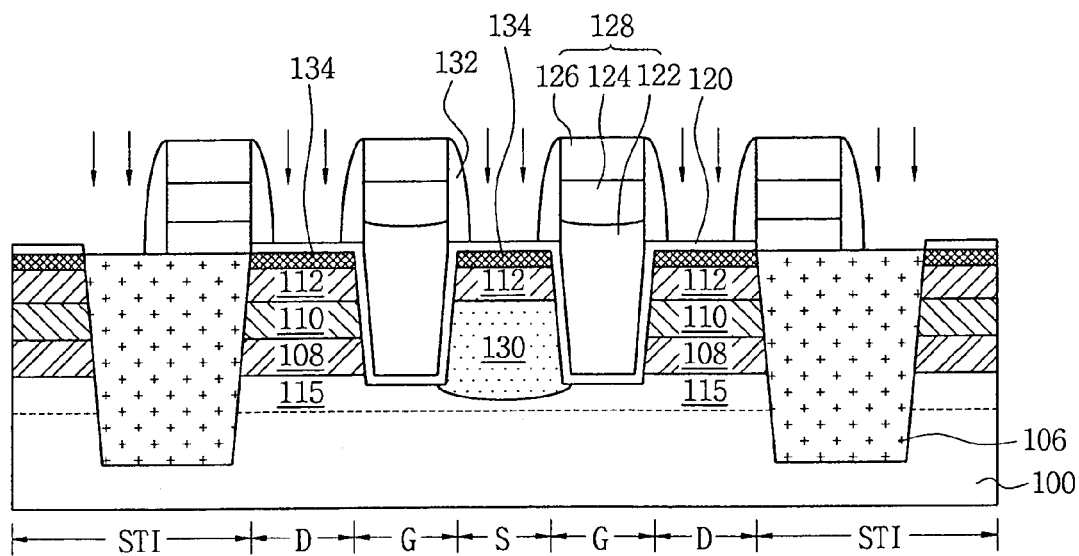
Figure 2P:
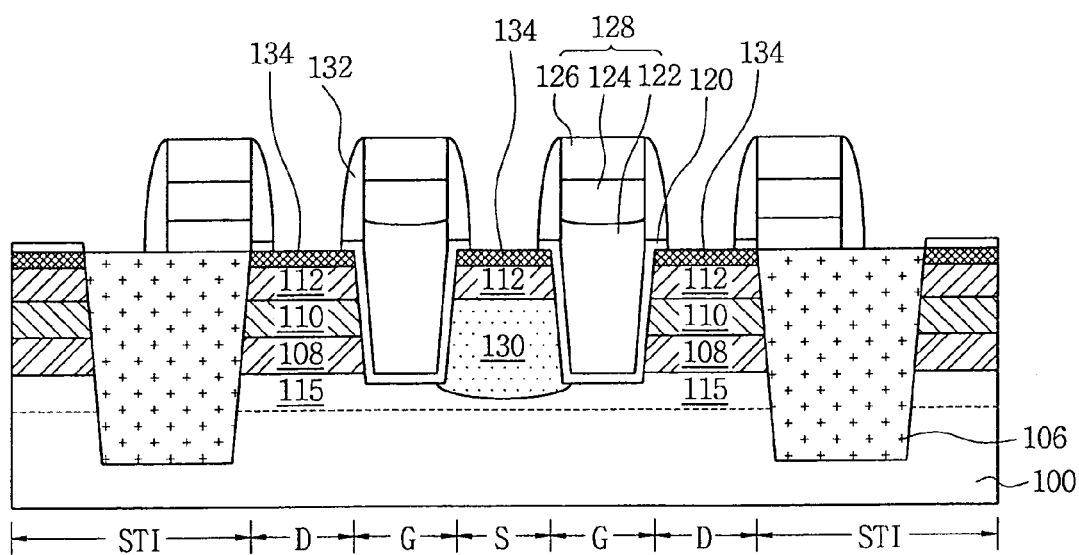
Figure 2Q:
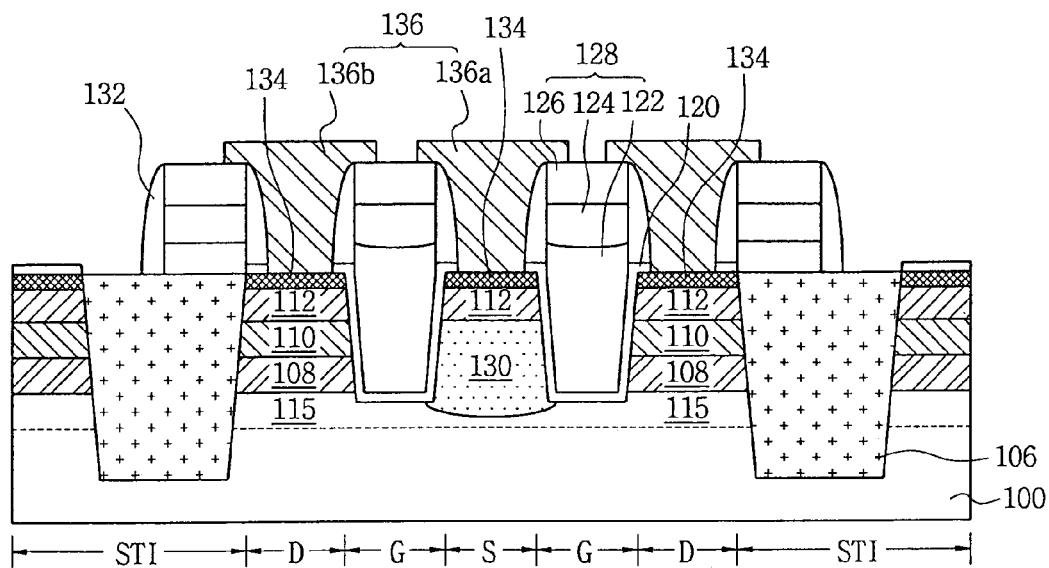

FIGS. 2A to 2Q are cross-sectional diagrams illustrating a method of manufacturing a recess type MOS transistor according to some embodiments of the invention.

Referring to FIG. 2A, a first pad oxide layer 102 and a first hard mask layer 104 are sequentially formed on the semiconductor substrate 100. The first pad oxide layer 102 may be formed to a thickness of about 300 Å to 1000 Å through an MTO (Medium Temperature Oxide) method. The first hard mask layer 104 may be formed to a thickness of about 500 Å to 2000 Å through a chemical vapor deposition (CVD) by using a silicon nitride layer or silicon oxide nitride layer. Although not shown in the drawing, in alternative embodiments of the invention a molding polysilicon layer may be additionally formed between the first pad oxide layer 102 and the first hard mask layer 104.

As shown in FIG. 2B, photoresist PR is deposited on the semiconductor substrate 100 where the first hard mask layer 104 was formed, and is then patterned through a photolithography process. The photolithography process is adapted to align a photo mask on the photoresist PR, photosensitize the photoresist PR exposed from the photo mask by using ultraviolet rays, and develop and pattern the photoresist PR. The first hard mask layer 104 is etched to expose the first pad oxide layer 102 by using the photoresist PR as an etch mask. The etching process of the first hard mask layer 104 may be performed through a dry etching method having a prominent anisotropic and vertical characteristic. In the etching process of the first hard mask layer 104, the first pad oxide layer 102 serves as an etching stop layer. Next, the photoresist PR is removed.

In FIG. 2C, the first pad oxide layer 102 is removed to expose the semiconductor substrate 100 by using the first hard mask layer 104 as an etching mask. The etching process of the first pad oxide layer 102 is called a BT (Break—Through) process. The BT process may be performed through a dry etching. Also, in the etching process of the first pad oxide layer 102, the surface of the semiconductor substrate 100 serves as an etching stop layer. The surface of the semiconductor substrate 100 is etched to a predetermined depth, e.g., about 2000 Å to about 5000 Å, by using the first hard mask layer 104 and the first pad oxide layer 102 as an etch mask layer, to thus form a first trench T1. The process of etching the semiconductor substrate 100 and forming the first trench T1 is called an ME (Main Etching) process. The BT process and the ME process may be performed in situ in a reaction chamber. The ME process may also be performed by the dry etching, and the dry etching is performed to sequentially etch multi-layer thin layers through different etching rates in conformity with layer material with mutually different kinds of reactive gases. At this time, the first trench T1 is formed to have a depth of about 2000 Å to 5000 Å from the surface of the semiconductor substrate 100.

In FIG. 2D, inside the first trench T1 formed on the semiconductor substrate 100, the surface of the semiconductor substrate 100 that is exposed through a thermal oxidation process is selectively oxidized, to form a device isolation film 106. In embodiments where the molding polysilicon layer is further formed between the first pad oxide layer 102 and the first hard mask layer 104, it may operate as a buffer layer by buffering stress caused by a volume expansion generated in forming the device isolation film 106. The semiconductor substrate 100 and the device isolation film 106 is planarized through a CMP or etch back process. This planarization process is performed to remove all the first hard mask layer 104 and the first pad oxide layer 102 and to flatten the surface of the semiconductor substrate 100.

As shown in FIG. 2E, a first conductive impurity of a P-type, e.g., boron or $BF_2$, is ion implanted on the semiconductor substrate 100 at a low density, e.g., about $1.0 \times 10^{12}$ atoms/cm$^2$ to about $1.0 \times 10^{14}$ atoms/cm$^2$, and with an energy of about 100 KeV to about 500 KeV, thus forming the channel impurity region.

On the semiconductor substrate where the channel impurity region was formed, a second conductive impurity of an N-type, e.g., As (Arsenic) or P (phosphorus), is ion implanted at a low density, e.g, about $1.0 \times 10^{12}$ atoms/cm$^2$ to about $1.0 \times 10^{14}$ atoms/cm$^2$, with an energy of about 70 KeV to about 100 KeV, to form the first impurity region 108 having a predetermined depth, e.g., about 800 Å to about 1500 Å, from the surface of the active region ACT.

On the semiconductor substrate where the first impurity region 108 was formed, the first conductive impurity of P-type, e.g., boron or $BF_2$, is ion implanted at a low density, e.g, about $1.0 \times 10^{12}$ atoms/cm$^2$ to about $1.0 \times 10^{14}$ atoms/cm$^2$, with energy of about 40 KeV to about 60 KeV, to thus form the second impurity region 110 having a predetermined depth, e.g., about 500 Å to about 900 Å, from the surface of the active region ACT.

On the semiconductor substrate where the second impurity region 110 was formed, the second conductive impurity of N-type, e.g., As or P, is ion implanted at a low density, e.g, about $1.0 \times 10^{12}$ atoms/cm$^2$ to about $1.0 \times 10^{14}$ atoms/cm$^2$, with energy of about 30 KeV to about 50 KeV, to thus form the third impurity region 112 having a predetermined depth, e.g., about 400 Å to about 600 Å, from the surface of the active region ACT.

Herewith, the channel impurity region may be called a P-well, and it is formed on a face of the semiconductor substrate 100, except for the device isolation film 106, thus a specific reference character or number is not provided with the drawings. The P-type impurity diffuses more actively on the semiconductor substrate, as compared with the N-type impurity, that is, the P-type impurity may be ion implanted in the semiconductor substrate deeper and with energy smaller than the N-type impurity, in comparison with the N-type impurity. In compliance with the impurity ion-implantation energy, the channel impurity region and the first through third impurity regions 108, 110, and 112 are formed respectively and sequentially from a bulk of the semiconductor substrate to the surface. In the first to third impurity regions 108, 110, and 112, the ion implantation energy and the density of energy for the impurities should be controlled to reduce a density of the P-type and N-type impurity on each boundary area.

Herewith, the channel impurity region is formed on a face of the semiconductor substrate 100, except for the device isolation film 106, thus a specific reference character or number is not provided with the drawings. Furthermore, before forming the first through third impurity regions 108, 110, and 112, the P-type impurity may be ion implanted with energy of about 90 KeV to about 120 KeV and at a high density, e.g., about $1.0 \times 10^{13}$ atoms/cm$^2$ to about $1.0 \times 10^{15}$ atoms/cm$^2$ to form the second channel stopper region 115 that can include a second trench bottom to be formed later, in a lower part of the first impurity region 108.

Therefore, according to some embodiments of the invention, in forming the channel having the recess structure in the active region ACT of the semiconductor substrate 100, there can be contained at least two diode components to a depth direction by using the first to third impurity regions 108, 110, and 112, and the channel impurity region. In other words, the transistor characteristic is improved and the density of the P-type or N-type impurity that is ion-implanted into the first to third impurity regions 108, 110, and 112 is reduced, resulting in substantially reduced junction leakage current in the first to third impurity regions 108, 110, and 112. Furthermore, a short channel effect may be prevented or substantially reduced by forming the second channel stopper region having a boundary with the first impurity region. At this time, the ion implantation of P-type impurity for the channel impurity region may not be performed.

In FIG. 2F, a second pad oxide layer 114 and a second hard mask layer 116 are sequentially accumulated on the semiconductor substrate 100 on which the channel impurity region was formed. The second pad oxide layer 114 is formed to have a predetermined thickness, e.g., about 200 Å to about 500 Å, through an MTO (Medium Temperature Oxide) method. The second hard mask layer 116 is formed from a silicon nitride layer or an oxide nitride layer (SiON) to a predetermined thickness, e.g., about 300 Å to 1000 Å, through a CVD method.

In FIG. 2G, photoresist PR is deposited on a face of the semiconductor substrate 100 on which the second hard mask layer 116 was formed, and is then patterned through a photolithography process to expose the second hard mask layer 116 of the gate region G. The second hard mask layer 116 is etched to expose the second pad oxide layer 114 by using the photoresist PR as an etch mask. Then, the photoresist is removed. The etching of the second hard mask layer 116 is performed through dry etching. The etching of the second hard mask layer 116 defines an open critical dimension of the second trench (T2 of FIG. 2H) in a subsequent process. Furthermore, the second pad oxide layer 114 serves as an etching stop layer in etching the second hard mask layer 116. Then, the photoresist is removed.

As shown in FIG. 2H, the second pad oxide layer 114 is removed to expose the semiconductor substrate 100 through the dry etching by using the second hard mask layer 116 as an etch mask. The surface of the semiconductor substrate 100 is etched to a predetermined depth by using the second hard mask layer 116 or the second pad oxide layer 114 as an etch mask layer, to thus form the second trench T2. At this time, the second hard mask layer 116 serves as a sacrificial layer, and may be partially or entirely removed during formation of the second trench T2. The BE process of removing the second pad oxide layer 114, and the ME process of forming the second trench T2 by etching the semiconductor substrate 100, are performed in situ with different kinds of reactive gases in one etching apparatus. Herewith, since in the second trench T2, a depth profile may become different in conformity with an open critical dimension, the trench T2 is formed to have a uniform open critical dimension (CD). For example, under a design rule of deep sub-micron meter, the second trench T2 is formed to have the open CD of about 500 Å to about 1000 Å and a depth of about 1000 Å to about 2000 Å. At this time, the bottom of the second trench T2 should be formed deep enough to form a boundary with the channel impurity region. Though not shown in the drawing, after forming the second trench T2 a sidewall of the second trench T2 is removed through a CDE (chemical Dry Etching) of isotropic etching method or a wet etching method, to separate the source region S from the drain region D. This isotropic etching method or wet etching method isotropically etches the surface of semiconductor substrate 100 provided within the second trench T2, thus not only the sidewall of the second trench T2 but also a depth of the second trench T2 may be further increased. The second trench T2 should be formed to have a bottom in the second channel stopper region 115, at least over the first impurity region 108.

In the inventive manufacturing method of the recess type MOS transistor, the bottom of the second trench T2 is formed in the second channel stopper region 115 into which the P-type type impurity of high density is ion implanted, therefore, the short channel effect may be prevented.

As shown in FIG. 2I, the second hard mask layer 116 and the second pad oxide layer 114 formed on the semiconductor substrate 100 are removed through the wet etching method, to expose the semiconductor substrate 100 and the surface of the device isolation film 106.

In FIG. 2J, a gate insulation layer 120 made of a silicon oxide layer of about 30 Å to about 120 Å thick is formed on the semiconductor substrate 100 where the second trench T2 was formed, by using a thermal oxidation method.

In FIG. 2K, on the semiconductor substrate 100 on which the gate insulation 120 was formed, a gate electrode 122 is formed of polysilicon through a CVD process. On the semiconductor substrate 100 on which the gate electrode 122 was formed, a metal layer 124 is formed of a metal silicide, for example, a tungsten silicide or a titanium silicide. On a face of the semiconductor substrate 100 where the metal layer 124 was formed, a gate upper insulation layer 126 is formed from a silicon nitride layer. That is, these layers are accumulated sequentially.

As shown in FIG. 2L, photoresist is deposited on the semiconductor substrate 100 where the gate upper insulation layer 126 was formed, and is then patterned through a photolithography process. The gate upper insulation layer 126, the metal layer 124, and the gate electrode 122 is formed on the source/drain regions S/D and the device isolation film 106 are sequentially removed through a dry etching method by using the photoresist as an etch mask, to thus form a gate stack 128 on the gate region G. At this time, a CD of the gate stack 128 is smaller than or equal to an open CD of a trench. Meanwhile, when the CD of the gate stack 128 is larger than the open CD of the second trench T2, a loading capacitance increases on the surface of the semiconductor substrate 100 of source/drain regions S/D adjacent to the gate electrode 122 when an external power source voltage is applied to the gate electrode 122. This causes a drop of device performance. Also, after forming the device isolation film, the first to third impurity regions 108, 110, and 112 may be formed after the formation of the gate stack 128.

As shown in FIG. 2M, on the semiconductor substrate 100 where the gate stack 128 was formed, photoresist PR is deposited, and is then patterned through a photolithography process to selectively expose only the source region S. In the semiconductor substrate 100 of the source region S, a first conductive impurity of P-type, e.g., boron or $BF_2$, is ion implanted to a high density, e.g., about $1.0 \times 10^{13}$ atoms/cm$^2$ to about $1.0 \times 10^{15}$ atoms/cm$^2$, with an energy of about 30 KeV to about 70 KeV, by using the photoresist PR and the gate stack 128 as an ion implantation mask, to thus form the fourth impurity region 130 as the first channel stopper region. This first channel stopper region 130 is formed to have a boundary with the channel impurity region including the first to third impurity regions 108, 110, and 112 that are formed on the source region S. The first channel stopper region 130 should be formed deep enough to exceed a depth of the first impurity region 108 formed on the source region S. In case the second channel stopper region 115 is formed in a lower part of the first impurity region 108, the first channel stopper region 130 may partially include the second channel stopper region 115 formed on the source region S. At this time, the first channel stopper region 130 can improve a characteristic of the vertical channel formed in the sidewall of the second trench T2, and the second channel stopper region 115 may improve a characteristic of the horizontal channel formed in the bottom of the second trench T2. Also, when the first channel stopper region 130 is formed over the bottom of second trench T2 in the source region S, it may invade into the gate region G of the second trench T2 bottom that is adjacent to the source region S, so as to be formed extendedly.

Therefore, in the inventive manufacturing method of the recess type MOS transistor, the source region S is selectively exposed by using photoresist PR, and a P-type impurity is ion implanted into the source region S by using the photoresist PR as an ion implantation mask, to thus form the first channel stopper region 130 and thereby form an asymmetrical channel in the source region S and the drain region D. Furthermore, from the characteristic of transistor, the drain region D related with a charge storage of cell capacitor can reduce a junction leakage current by forming the first to third impurity regions 108, 110, and 112. In addition, the source region S corresponding to the drain region D can improve a characteristic of the threshold voltage of the transistor regardless of the junction leakage current, by forming the first and second channel stopper regions 130 and 115.

In reducing the open CD and the depth of the second trench T2, the channel stopper region is formed in the source region S, without reducing a depth of the third impurity region 112 formed in the drain region D or without more reducing a density of the P-type or N-type impurity that is ion-implanted into the third impurity region 112 and the second impurity region 110, thereby enabling a threshold voltage of the transistor to increase and preventing or substantially reducing the short channel effect.

In FIG. 2N, an insulation layer such as a silicon nitride layer, a silicon oxide nitride layer, or a silicon oxide layer is formed on the semiconductor substrate 100 where the first channel stopper region 130 was formed, in the source region S, through CVD. Then, the insulation layer is dry-etched, to form a spacer 132 on a sidewall of the gate stack 128. Herewith, the spacer 132 is obtained by forming the insulation layer so as to get a prominent step coverage in a flute such as the sidewall of the gate stack 128, that is, by forming the insulation layer thicker than a flat face thereof. Then, by removing the insulation layer from an upper portion of the gate stack 128 by using a verticality and isotropy of the dry etching, the insulation layer selectively remains to isolate between the metal layer 124 and the gate electrode 122 in the sidewall of the gate stack 128. Thereby, the spacer 132 is formed.

In FIG. 2O, in the source region S and drain region D of the semiconductor substrate 100, a second conductive impurity of N-type, e.g., As or P, is ion implanted to a high density, e.g., about $1.0 \times 10^{14}$ atoms/cm$^2$ to about $1.0 \times 10^{16}$ atoms/cm$^2$, with energy of about 20 KeV to about 30 KeV, through a self alignment method that employs the spacer 132 as an ion implantation mask, to thus form a fifth impurity region 134. This fifth impurity region 134 can't be formed deeper than the third impurity region 112. Thus, in the source region S the fifth impurity region 134 and the first channel stopper region 130 have a deep junction correlation, so the junction leakage current may increase, but this is regardless of the characteristic of transistor, and it is easy to control a threshold voltage value of the transistor through use of the first and second channel stopper regions 130 and 115. Furthermore, in the drain region D corresponding to the source region S, the fifth impurity region 134 is formed to have a depth smaller than the third impurity region 112, and the third impurity region 112 or the second impurity region 110 has a shallow junction by each reducing a density of the N-type or P-type impurity that is ion-implanted into the third impurity region 112 or the second impurity region 110, thereby reducing the junction leakage current.

As shown in FIG. 2P, the gate insulation layer 120 is removed from the source/drain regions S/D where the fifth impurity region 134 was formed.

In FIG. 2Q, a polysilicon layer or a conductive metal layer containing the N-type impurity is formed on the semiconductor substrate 100 where the fifth impurity region 134 was formed, to thus form source/drain electrodes 136a and 136b (hereinafter, referred to as "pad polysilicon layer 136"), which are electrically connected with the fifth impurity region 134. On the semiconductor substrate 100 where the pad polysilicon layer 136 was formed, photoresist is deposited, and is then patterned through a photolithography process. Then, the pad polysilicon layer 136 formed on the respective source/drain regions S/D is separated by using the photoresist as an etch mask.

Next, a second interlayer insulation layer is formed on the semiconductor substrate 100 where the pad polysilicon layer 136 was formed, and the second interlayer insulation layer is removed from an upper part of the source region S, to thus form a first contact hole. A bit line contact is formed through the first contact hole to electrically connect to the pad polysilicon layer 136. Also, a third interlayer insulation layer is formed on the semiconductor substrate 100 including the bit line contact, and the second and third interlayer insulation layers are removed from an upper part of the drain region D, to thus form a second contact hole. Thereon, a storage electrode, a dielectric layer, and a plate electrode, which are electrically coupled with a drain electrode of a cell transistor through the second contact hole, are sequentially formed, completing the capacitor of the memory cell.

In a MOS transistor manufactured through such a method, data applied to the bit line is stored in the memory cell capacitor by a gate voltage applied to the gate electrode 122, and then data stored in the memory cell capacitor is outputted by a gate voltage applied to the gate electrode 122.

In the recess type transistor manufacturing method of the invention, the first to third impurity regions 108, 110, and 112 having a shallow junction with the channel impurity region are formed in the drain region D requiring an extreme reduction of the junction leakage current. In the source region S allowing the junction leakage current, the first channel stopper region 130 having a deep junction with the fifth impurity region 134 is formed. Thereby, a threshold voltage characteristic of the transistor may be improved and a refresh characteristic of the memory cell capacitor may increase.

That is, a density of conductive impurity ion-implanted into the first through third impurity regions 108, 110, and 112 and into the channel impurity region is reduced, diminishing the junction leakage current and enhancing the refresh characteristic of the cell capacitor formed in the drain region D.

As described above, according to an exemplary embodiment of the invention, a method of manufacturing a recess type MOS transistor improves a threshold voltage characteristic of transistor by forming a channel stopper region in a source region. Furthermore, a density of P-type and N-type impurity of first to third impurity regions formed in a drain region is lowered, thus substantially reducing a junction leakage current caused by a PN junction. A refresh characteristic of a cell capacitor formed on the drain region may be improved.

In addition, when the open CD and depth of the second trench T2 are reduced, a channel stopper region is formed in a source region, without reducing a depth of the third impurity region and a density of N-type impurity ion-implanted in the third impurity region, thereby preventing or substantially reducing a short channel effect.

Embodiments of the invention may be practiced in many ways. What follows are exemplary, non-limiting descriptions of some of these embodiments.

One exemplary embodiment of the invention provides a method of manufacturing a recess type MOS transistor, including forming a channel impurity region by ion implanting a first conductive impurity in an active region of a semiconductor substrate; alternately and respectively ion-implanting a second conductive impurity and the first conductive impurity into the active region on which the channel impurity region was formed, to thus sequentially form first to third impurity regions having a dual diode structure from the channel impurity region, the second conductive impurity having conductivity opposite to the first conductive impurity; forming a trench that is adapted to pierce through the first to third impurity regions and that has a bottom in the channel impurity region; forming a gate insulation layer in a gate region of the semiconductor substrate in which the trench was formed, to thus form a gate stack; selectively ion implanting a first conductive impurity in a source region of the semiconductor substrate having the formation of the gate stack, to form a fourth impurity region having a boundary with the channel impurity region in the source region; forming a spacer in a sidewall of the gate stack; and ion implanting the second conductive impurity in the source/drain regions by using the spacer and the gate stack as an ion implantation mask, to form a fifth impurity region.

Another exemplary embodiment of the invention provides a method of manufacturing a recess type MOS transistor, including forming a gate stack along an upper part of a gate insulation layer formed by a recess type in a gate formation region defined in an active region of a semiconductor substrate; forming a channel stopper region so that a recess channel is asymmetrically formed in one lower part of the gate insulation layer, in a lower part of the active region on which a drain electrode or source electrode of the transistor will be formed; and forming first to third impurity regions in another lower part of the gate insulation layer in a dual diode impurity layer structure, to prevent a junction leakage current.

Another exemplary embodiment of the invention provides a structure of recess type MOS transistor, including a gate stack that is formed along an upper part of a gate insulation layer formed by a recess type in a gate region that is defined in an active region of a semiconductor substrate; a first channel stopper region, which is formed to have a depth corresponding to the bottom neighborhood of a recess in the active region on which a drain electrode or source electrode of the transistor will be formed, so that the recess channel is asymmetrically formed only in one side part including a lower part of the gate insulation layer; and first to third impurity regions having a depth smaller than the bottom of the recess, the first to third impurity regions having a dual diode impurity layer to reduce a junction leakage current, in an active region of another side part including a lower part of the gate insulation layer on which the first channel stopper region is not formed.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents.

We claim:

1. A method of manufacturing a recess type Metal-Oxide Semiconductor (MOS) transistor, the method comprising:

ion-implanting a first conductive impurity in an active region of a semiconductor substrate to form a channel impurity region;

alternately ion-implanting a second conductive impurity and the first conductive impurity into a portion of the active region where the channel impurity region is disposed to form a first, a second, and a third impurity region having a dual diode structure on the channel impurity region, the second conductive impurity having a conductivity opposite that of the first conductive impurity;

opening a trench in a gate region of the semiconductor substrate, the trench piercing the first, the second, and the third impurity regions and having a bottom in the channel impurity region;

depositing a gate insulation layer in the gate region of the semiconductor substrate and in the trench;

forming a gate stack in the gate region;

ion-implanting the first conductive impurity in a source region of the semiconductor substrate where the gate stack was formed to form a fourth impurity region having a boundary with the channel impurity region in the source region;

depositing a spacer on a sidewall of the gate stack; and ion-implanting the second conductive impurity in the source region and a drain region using the spacer and the gate stack as an ion implantation mask to form a fifth impurity region.

2. The method as claimed in 1, wherein alternately ion-implanting comprises forming the first impurity region to a depth of about 800 Å to about 1500 Å from the surface of the active region.

3. The method as claimed in 2, wherein forming the first impurity region comprises ion-implanting the second conductive impurity at an energy of about 70 KeV to about 100 KeV.

4. The method as claimed in 2, wherein forming the first impurity region comprises ion-implanting the second conductive impurity to a density of about $1.0 \times 10^{12}$ atoms/cm$^2$ to about $1.0 \times 10^{14}$ atoms/cm$^2$.

5. The method as claimed in 1, wherein alternately ion-implanting comprises forming the second impurity region to a depth of about 500 Å to about 900 Å from the surface of the active region.

6. The method as claimed in 5, wherein forming the second impurity region comprises ion-implanting the first conductive impurity at energy of about 40 KeV to about 60 KeV.

7. The method as claimed in 5, wherein forming the second impurity region comprises ion-implanting the first conductive impurity to a density of about $1.0 \times 10^{12}$ atoms/cm$^2$ to about $1.0 \times 10^{14}$ atoms/cm$^2$.

8. The method as claimed in 1, wherein alternately ion-implanting comprises forming the third impurity region to a depth of about 400 Å to about 600 Å from the surface of the active region.

9. The method as claimed in 8, wherein forming the third impurity region comprises ion-implanting the second conductive impurity at energy of about 30 KeV to about 50 KeV.

10. The method as claimed in 8, wherein forming the third impurity region comprises ion-implanting the second conductive impurity to a density of about $1.0 \times 10^{12}$ atoms/cm$^2$ to about $1.0 \times 10^{14}$ atoms/cm$^2$.

11. The method as claimed in 1, further comprising ion-implanting the first conductive impurity between the first impurity region and the channel impurity region to form a channel stopper region.

12. The method as claimed in 11, wherein ion-implanting the first conductive impurity to form the channel stopper region comprises ion-implanting the first conductive impurity at an energy of about 80 KeV to about 120 KeV.

13. The method as claimed in 11, wherein ion-implanting the first conductive impurity to form the channel stopper region comprises ion-implanting the first conductive impurity to a density of about $1.0 \times 10^{13}$ atoms/cm$^2$ to about $1.0 \times 10^{15}$ atoms/cm$^2$.

14. The method as claimed in 11, further comprising ion-implanting the first conductive impurity in a bottom of the trench.

15. The method as claimed in 1, wherein opening the trench opening a trench with an open critical dimension of about 500 Å to 1000 Å.

16. The method as claimed in 1, wherein opening the trench comprises opening a trench to a depth of about 1000 Å to about 2000 Å.

17. The method as claimed in 1, wherein alternately ion-implanting the second conductive impurity and the first conductive impurity occurs after depositing the gate insulation layer to form the gate stack.

18. The method as claimed in 1, wherein ion-implanting the first conductive impurity comprises ion-implanting one selected from the group consisting of boron and $BF_2$.

19. The method as claimed in 1, wherein ion-implanting the second conductive impurity comprises ion-implanting one selected from the group consisting of As and phosphorus.

20. The method as claimed in 1, wherein depositing the gate insulation layer comprises depositing the gate insulation layer to a thickness of about 30 Å to about 120 Å.

21. The method as claimed in 1, wherein the gate stack includes a gate electrode that fills the trench, a metal layer on the gate electrode, and a gate upper insulation layer on the metal layer.

22. The method as claimed in 21, wherein the gate electrode comprises polysilicon that contains one chosen from the group consisting of the first conductive impurity and the second conductive impurity.

23. The method as claimed in 21, wherein the metal layer consists of at least one chosen from the group consisting of tungsten silicide, aluminum silicide, and titanium silicide.

24. The method as claimed in 21, wherein the gate upper insulation layer consists of a silicon nitride layer.

25. The method as claimed in 21, wherein ion-implanting the first conductive impurity to form the fourth impurity region comprises selectively ion-implanting the first conductive impurity in the source region by using photoresist and the gate stack as an ion implantation mask.

26. The method as claimed in 1, wherein ion-implanting the first conductive impurity to form the fourth impurity region comprises ion-implanting the first conductive impurity at an energy of about 50 KeV to about 70 KeV.

27. The method as claimed in 1, wherein ion-implanting the first conductive impurity to form the fourth impurity region comprises ion-implanting the first conductive impurity to a density of about $1 \times 10^{13}$ atoms/cm$^2$ to $1 \times 10^{15}$ atoms/cm$^2$.

28. The method as claimed in 1, wherein the fourth impurity region includes at least the first impurity region.

29. The method as claimed in 1, wherein the fourth impurity region is formed to a bottom of the trench.

30. The method as claimed in 1, wherein ion-implanting the second conductive impurity to form the fifth impurity region comprises ion-implanting the second conductive impurity at an energy of about 20 KeV.

31. The method as claimed in 1, wherein ion-implanting the second conductive impurity to form the fifth impurity region comprises ion-implanting the second conductive impurity to a density of about $1 \times 10^{14}$ atoms/cm$^2$ to $1 \times 10^{16}$ atoms/cm$^2$.

32. The method as claimed in 1, wherein ion-implanting the second conductive impurity to form the fifth impurity region comprises ion-implanting the second conductive impurity to a shallower depth than the third impurity region.

33. A method of forming a recess type MOS transistor comprising:

forming a gate stack along an upper part of a recess-type gate insulation layer formed in a gate formation region that is defined in an active region of a semiconductor substrate;

forming a channel stopper region so that a recess channel is asymmetrically formed in a first lower part of the gate insulation layer and in a lower part of the active region where a drain electrode or a source electrode of the transistor will be formed; and forming a first, a second, and a third impurity region in a second lower part of the gate insulation layer to form a dual diode impurity layer structure that prevents a junction leakage current.

34. The method as claimed in 33, wherein forming the channel stopper region comprises forming the channel stopper region to a depth that corresponds to a bottom neighborhood of the recess.

35. The method as claimed in 33, wherein forming the channel stopper region comprises ion-implanting a first conductive impurity to a density of at least about $1\times10^{13}$ atoms/cm$^2$.

36. The method as claimed in 33, further comprising ion-implanting a second conductive impurity in the active region of the semiconductor substrate having the channel stopper region to form a channel impurity region.

37. The method as claimed in 36, wherein ion-implanting the second conductive impurity comprises ion-implanting the second conductive impurity to a density of at least about $1\times10^{14}$ atoms/cm$^2$.

38. The method as claimed in 36, wherein the second conductive impurity has a conductivity opposite to a third conductive impurity that is ion-implanted in the first impurity region.

39. The method as claimed in 33, wherein forming the first, the second, and the third impurity regions comprises ion-implanting a conductive impurity having a density under about $1\times10^{14}$ atoms/cm$^2$ into at least two regions of the semiconductor substrate.

* * * * *

UNITED STATES PATENT AND TRADEMARK OFFICE
CERTIFICATE OF CORRECTION

PATENT NO. : 7,300,845 B2 Page 1 of 1
APPLICATION NO. : 11/022056
DATED : November 27, 2007
INVENTOR(S) : Hyeoung-Won Seo et al.

It is certified that error appears in the above-identified patent and that said Letters Patent is hereby corrected as shown below:

Column 8, line 39, the words "P-type type" should read -- P-type --.

Signed and Sealed this

Thirtieth Day of September, 2008

JON W. DUDAS
*Director of the United States Patent and Trademark Office*